US009642291B1

(12) United States Patent
Peng et al.

(10) Patent No.: US 9,642,291 B1
(45) Date of Patent: May 2, 2017

(54) EMI PROOF SERVER CHASSIS

(71) Applicants: Inventec (Pudong) Technology Corporation, Shanghai (CN); INVENTEC CORPORATION, Taipei (TW)

(72) Inventors: Ying-Chao Peng, Taipei (TW); Chi-Cheng Hsiao, Taipei (TW); Kuo-En Chang, Taipei (TW); Chih-Wei Chiang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/157,394

(22) Filed: May 17, 2016

(30) Foreign Application Priority Data

Nov. 23, 2015  (CN) .......................... 2015 1 0817232

(51) Int. Cl.
*H05K 9/00* (2006.01)
*H05K 7/14* (2006.01)

(52) U.S. Cl.
CPC ......... *H05K 9/0064* (2013.01); *H05K 7/1488* (2013.01); *H05K 9/0007* (2013.01)

(58) Field of Classification Search
CPC .................................................. H05K 7/1488
See application file for complete search history.

(56) References Cited

U.S. PATENT DOCUMENTS

| 6,061,966 | A | * | 5/2000 | Nelson | E05C 17/14 220/831 |
|---|---|---|---|---|---|
| 6,185,098 | B1 | * | 2/2001 | Benavides | H05K 7/1488 174/387 |
| 6,621,708 | B1 | * | 9/2003 | Sparkes | G06F 1/184 174/382 |
| 2011/0175503 | A1 | * | 7/2011 | Chamarti | H05K 7/1498 312/223.2 |
| 2012/0229987 | A1 | * | 9/2012 | Peng | H05K 9/0062 361/724 |
| 2013/0249359 | A1 | * | 9/2013 | Tang | H05K 5/0239 312/223.2 |
| 2014/0204540 | A1 | * | 7/2014 | Lin | H05K 7/1488 361/732 |
| 2015/0062796 | A1 | * | 3/2015 | Yu | G06F 1/181 361/679.31 |

* cited by examiner

*Primary Examiner* — Hung V Ngo
(74) *Attorney, Agent, or Firm* — CKC & Partners Co., Ltd.

(57) ABSTRACT

EMI-proof server chassis preventing EMI on an electronic component, includes a chassis and a double aperture flexible piece. The chassis includes a connection portion connected to the chassis, a first engagement portion and a second engagement portion. The first engagement portion and the second engagement portion are connected to and disposed on two sides of the connection portion. The first engagement portion and the second engagement portion are parallelly prolonged, and substantially opposite to each other. The double aperture flexible piece, shaped as a curvature plate, has a first aperture and a second aperture on two sides. The first engagement portion and the second engagement portion are engaged to the first aperture and the second aperture respectively, and the portion of the double aperture flexible piece between the first aperture and the second aperture is curved toward the electronic component, and contact with the electronic component.

10 Claims, 5 Drawing Sheets

EMI PROOF SERVER CHASSIS

RELATED APPLICATIONS

This application claims priority to Chinese Application Serial Number 201510817232.0, filed Nov. 23, 2015, which is herein incorporated by reference.

BACKGROUND

Field of Invention

The present disclosure relates to an EMI proof server chassis. More particularly, the present disclosure relates to establish connection between an electronic component and an EMI proof server chassis.

Description of Related Art

Generally speaking, a metal structure may be disposed in a chassis to provide a protection of electromagnetic interference (EMI) for electronic components disposed inside the chassis, such as universal serial bus connector. Otherwise, a EMI protection structure, provided and disposed in a chassis, may contact with electronic components inside the chassis, to form as a bridge of electrical connection between the electronic component and the chassis, such that the electronic component may adopt the chassis as a metal grounding through the EMI protection structure. Therefore, the electrostatic charges accumulated on the electronic components could be guided to grounding appropriately.

Conventional EMI protection structure fastened to the chassis usually needs a fixing structure forming on the EMI protection structure or adopts additional spools, such as screw, bolt . . . etc. Although each of various methods, mentioned above or not, has its pros and cons, on fastening the EMI protection structure to the chassis. However, a simplified method for fastening the EMI protection structure to the chassis also means that the EMI protection structure can be easily disassembled from the chassis, and a complicated method for fastening the EMI protection structure to the chassis also means more assembling times. As the consequence, the available structure of a EMI-proof server chassis, as described above, apparently exists with inconvenience and defect, which needs further improvement. Therefore, to deal with aforesaid problem effectively is an important subject of research and development, and also a desired improvement in the art.

SUMMARY

The present disclosure provides an EMI-proof server chassis for preventing EMI on an electronic component. The EMI-proof server chassis includes a chassis and a double aperture flexible piece. The chassis includes a connection portion, a first engagement portion and a second engagement portion. The connection portion is connected to the chassis. The first engagement portion and the second engagement portion are connected to the connection portion, and disposed on two sides of the connection portion. The first engagement portion and the second engagement portion are prolonged along a prolonged direction and substantially opposite to each other. The double aperture flexible piece, shaped as a curvature plate, has a first aperture and a second aperture on two sides. The first engagement portion and the second engagement portion are engaged to the first aperture and the second aperture respectively, and a portion of the double aperture flexible piece between the first aperture and the second aperture is curved toward the electronic component, and contact with the electronic component.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
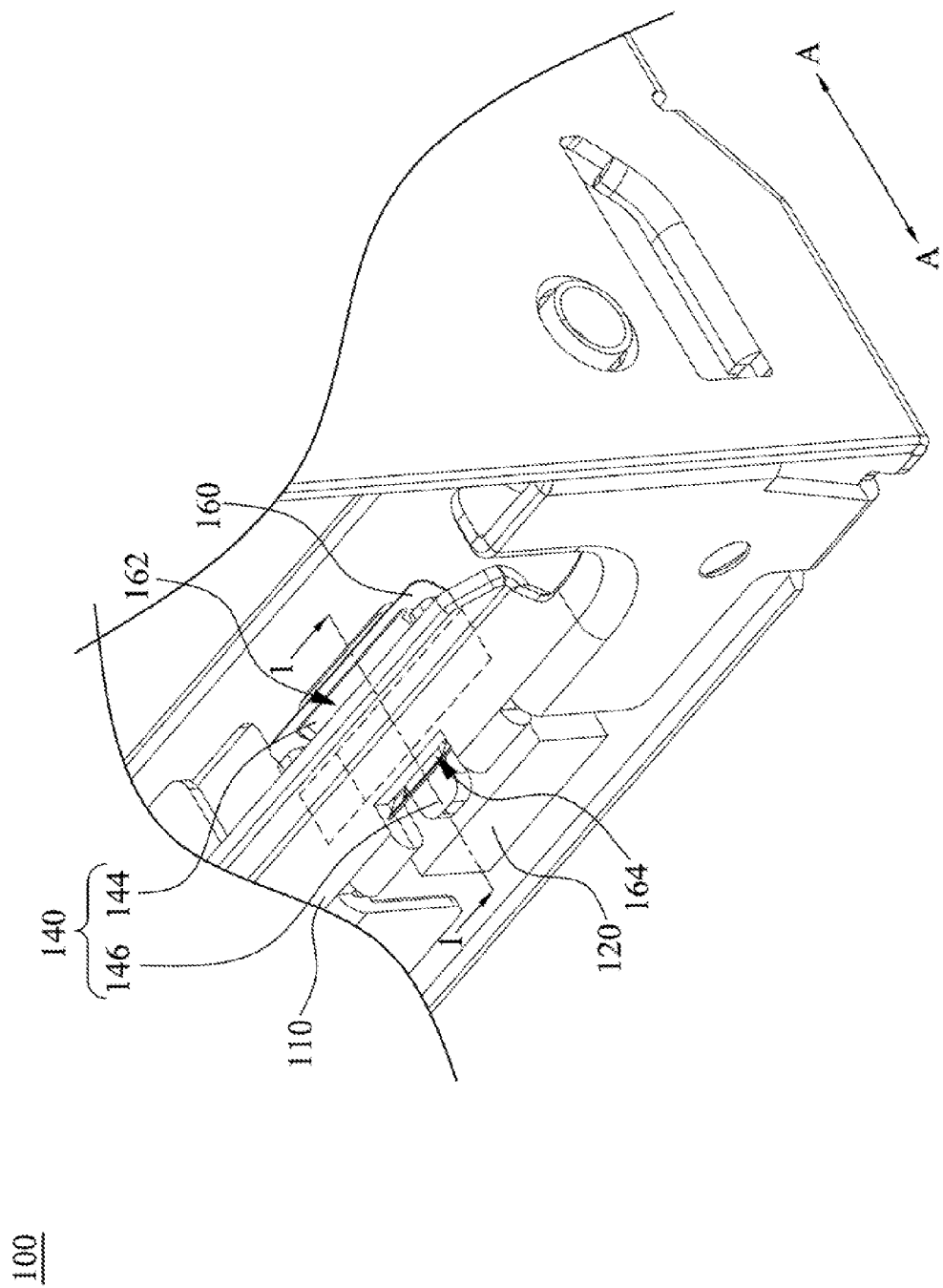
FIG. 1 is a 3D perspective view of an EMI-proof server chassis according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a 3D perspective view of an EMI-proof server chassis according to an embodiment of the present disclosure. As shown in FIG. 1, an EMI-proof server chassis 100 can be adopted for preventing EMI on an electronic component 120. The EMI-proof server chassis 100 includes a chassis 110, a fixing structure 140, and a double aperture flexible piece 160. The electronic component 120 is disposed inside the chassis 110. The fixing structure 140 includes a connection portion 142 (located at lower side of the chassis 110, may referred to FIG. 2B), a first engagement portion 144 and a second engagement portion 146. In some embodiments, the fixing structure 140 and the chassis 110 can be integrated. In some embodiments, the fixing structure 140 can be integrally formed with the chassis 110. The connection portion 142 is connected to the chassis 110. The first engagement portion 144 and the second engagement portion 146 are connected to the connection portion 142, and disposed on two sides of the connection portion 142. The first engagement portion 144 and the second engagement portion 146 are prolonged along a prolonged direction A relative to the connection portion 142, and substantially opposite to each other. That is, in some embodiment, the first engagement portion 144 and the second engagement portion 146 are respectively connected to two opposite sides of the connection portion 142, and the first engagement portion 144 and the second engagement portion 146 are prolonged along the prolonged direction A extending away from the connection portion 142.

Figure 3:
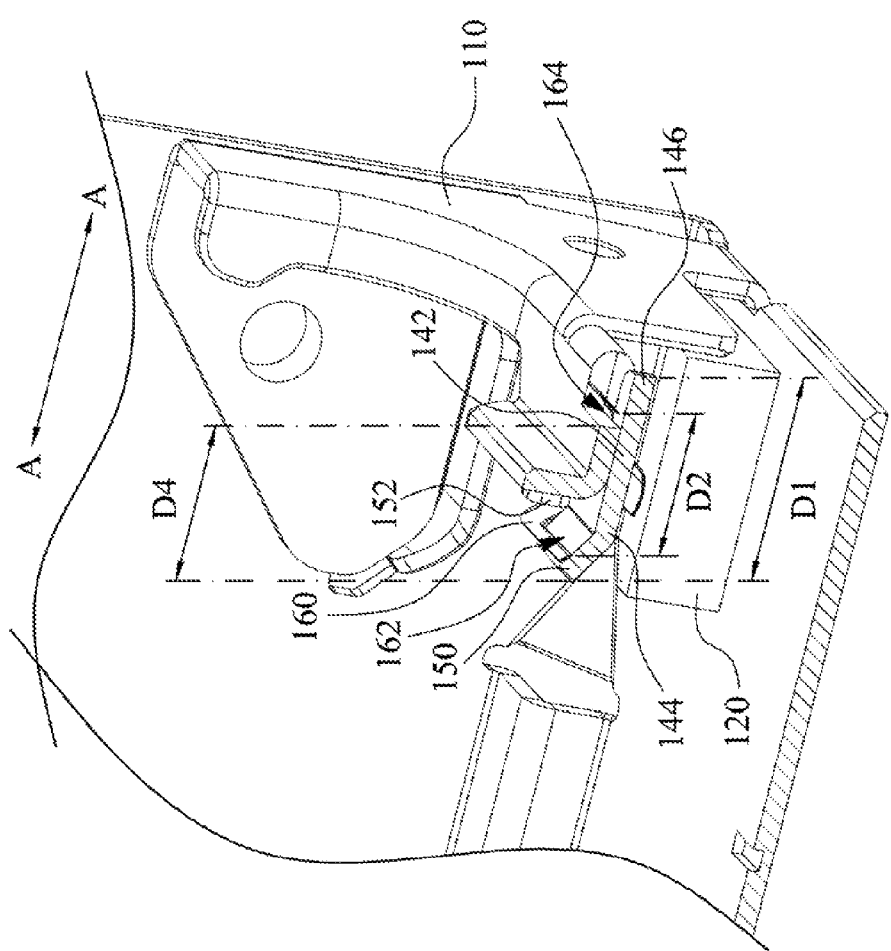
FIG. 3 is a longitude sectional view of an EMI-proof server chassis along line 1-1' in FIG. 1 according to an embodiment of the present disclosure.

The double aperture flexible piece 160, shaped as a curvature plate, has a first aperture 162 and a second aperture 164 on two sides. In some embodiments, the sectional area of the first aperture 162 is different from the sectional area of the second aperture 164, as for easily identified the first aperture 162 and the second aperture 164 of the double aperture flexible piece 160 during assembling. In some embodiments, the sectional area of the first aperture 162 is greater than the sectional area of the second aperture 164. The first engagement portion 144 and the second engagement portion 146 are engaged or fastened to the first aperture 162 and the second aperture 164 respectively, and a portion of the double aperture flexible piece 160 between the first aperture 162 and the second aperture 164 is curved toward the electronic component 120, and contact with the electronic component 120 (as shown in FIG. 3). In some embodiments, material of the double aperture flexible piece 160 may be metal, such as copper, copper alloy etc., or other suitable conductive material. The electronic component 120 is electrically-connected to the grounding structure through the double aperture flexible piece 160. The grounding structure, described herein, may represent a structure for preventing electrostatic discharge (ESD) or electromagnetic interference (EMI), for example, the chassis 110 with metal plate can be regarded as a grounding structure.

Owing to the double aperture flexible piece 160 is made by metal or conductive material, while the electronic component 120 is in contact with the double aperture flexible piece 160, such that the electronic component 120 can be electrically-connected to the chassis 110 with metal plate or other grounding structure through the double aperture flexible piece 160. Therefore, the double aperture flexible piece 160 can prevent or decrease the influence of electromagnetic interference (EMI) on the electronic component 120. In addition, the double aperture flexible piece 160 can conduct the electronic component 120 and the chassis 110 for discharging accumulated electrostatic charges on the electronic component 120, to prevent the electrostatic discharge (ESD).

Furthermore, owing to the double aperture flexible piece 160 is fastened to the fixing structure 140 through respectively engaged or fastened the first aperture 162 and the second aperture 164 to the first engagement portion 144 and the second engagement portion 146, which may imply that the double aperture flexible piece 160 can be fastened onto the chassis 110 without using additional fixing spool, such that assembling the double aperture flexible piece 160 and the chassis 110 can save assembling time. In the meanwhile, the usage of the double aperture flexible piece 160 also save the material or additional component. In addition, after the double aperture flexible piece 160 is fixed to the fixing structure 140 through the first engagement portion 144 and the second engagement portion 146, the double aperture flexible piece 160 can hardly be disassembled from the chassis 110, the detail structure feature would be described later.

Figure 2A:
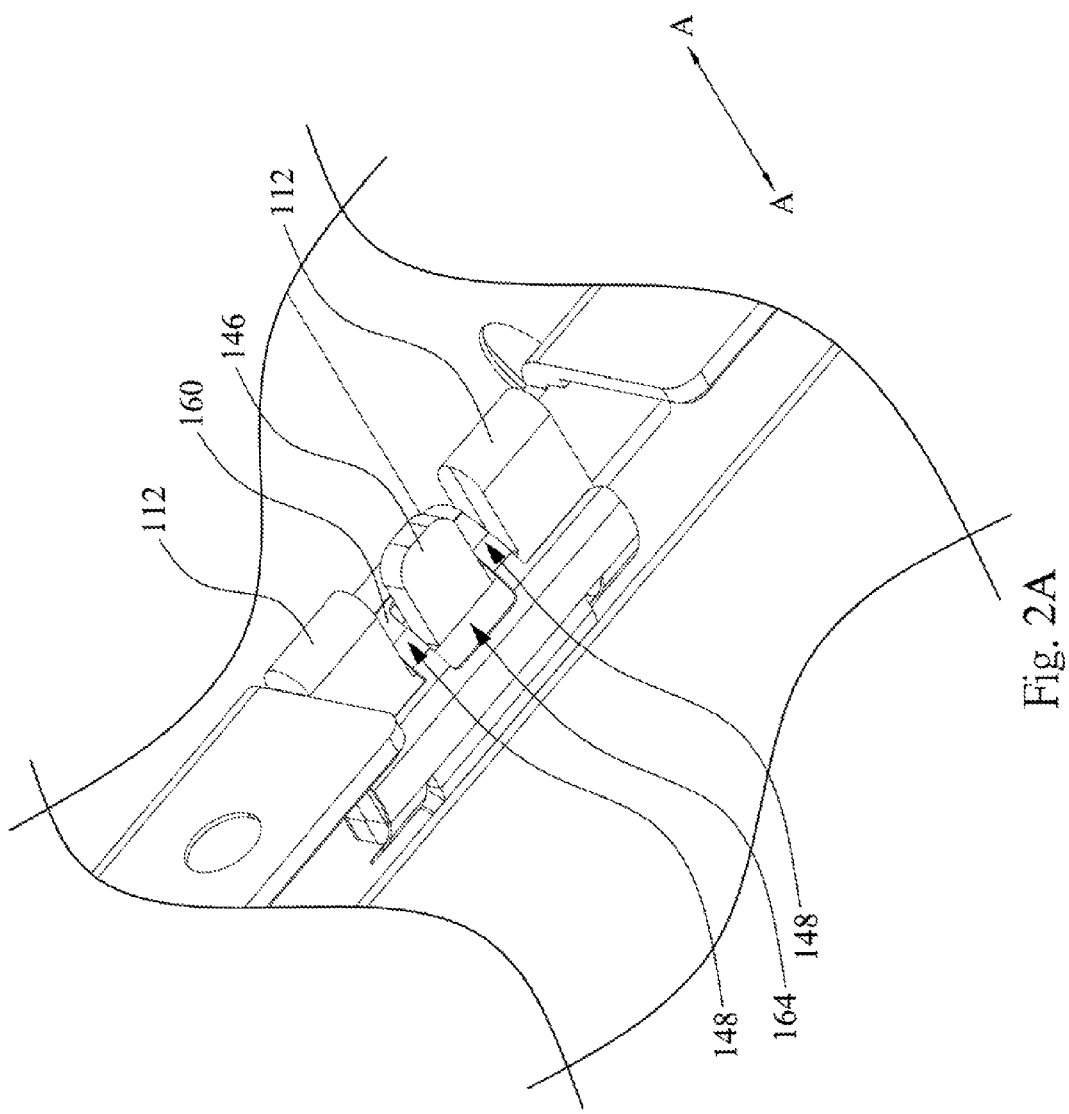
FIG. 2A is a 3D perspective view of an EMI-proof server chassis according to an embodiment of the present disclosure from another angle.
Figure 2B:
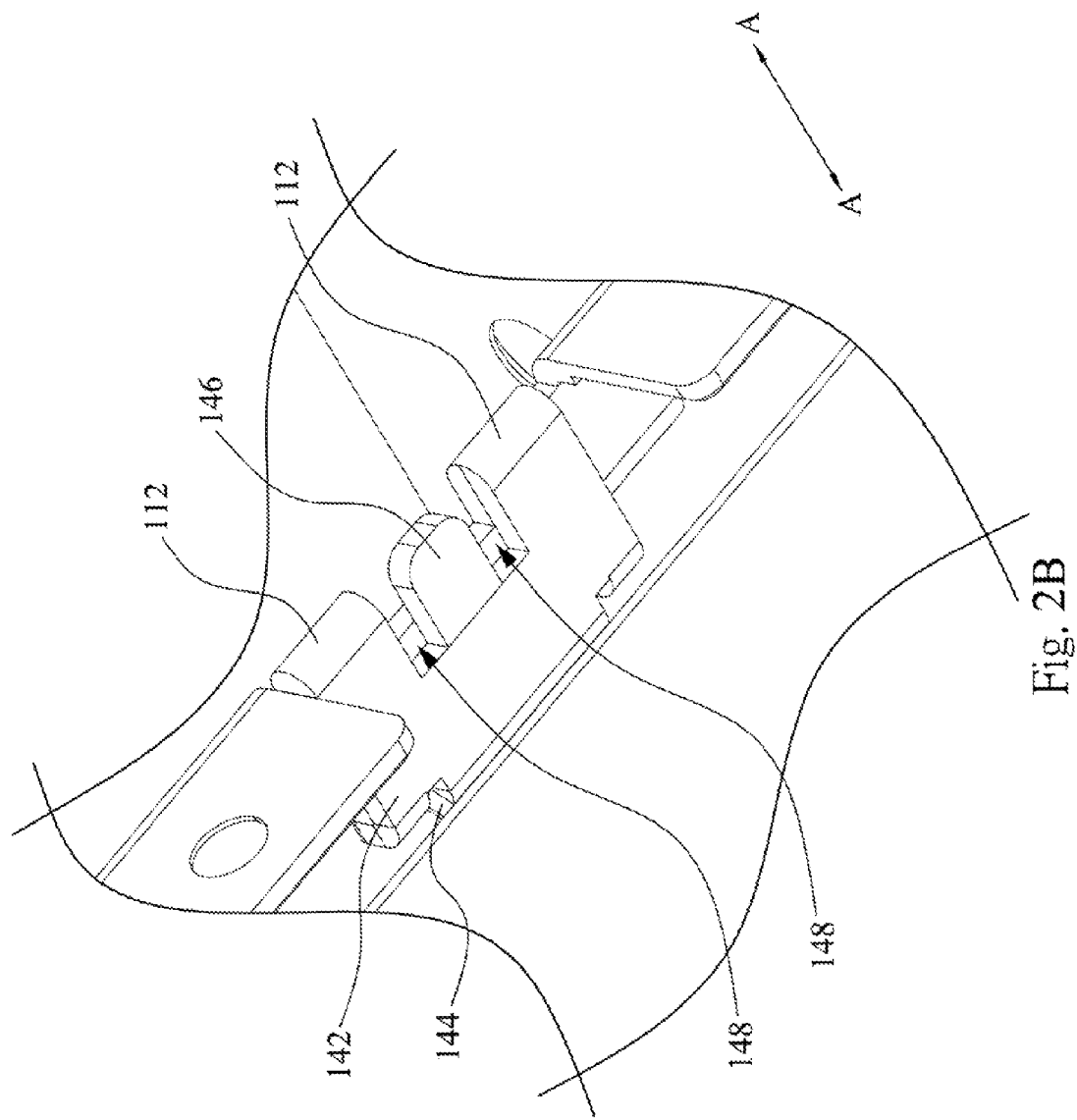
FIG. 2B is a 3D perspective view of a fixing structure of an EMI-proof server chassis according to an embodiment of the present disclosure from another angle.

FIG. 2A illustrates a 3D perspective view of an EMI-proof server chassis 100 according to an embodiment of the present disclosure from another angle. FIG. 2B illustrates a 3D perspective view of a fixing structure 140 of an EMI-proof server chassis 100 according to an embodiment of the present disclosure from another angle. As referred to FIG. 2A and FIG. 2B, the chassis 110 further includes a stopper portion 112. The stopper portion 112 is connected to an end of the chassis 110 close to the second engagement portion 146. In some embodiments, the stopper portion 112 can be regarded as a structure of the connection portion 140 extended along the prolonged direction A at same side with the second engagement portion 146. The stopper portion 112 is disposed on two sides of the second engagement portion 146. While the double aperture flexible piece 160 is fastened with the second engagement portion 146, the double aperture flexible piece 160 is partially restricted between the stopper portion 112 and the second engagement portion 146. Therefore, while fastening the double aperture flexible piece 160 onto the second engagement portion 146, the stopper portion 112 can also be regarded as guided component, to guide the double aperture flexible piece 160 follow the guiding of the stopper portion 112 for more smoothly fastening. In addition, the stopper portion 112 can restricted the compatible size of the double aperture flexible piece 160, such that the stopper portion 112 can also prevent confusing the second aperture 164 with the first aperture 162 during fastening the double aperture flexible piece 160.

In some embodiments, the stopper portion 112 and the second engagement portion 146, and the connection portion 142 of the chassis 110 are collectively formed trench portions 148. The trench portions 148 are adjoined the second engagement portion 146. In some embodiment, the trench portions 148 are respectively located between the stopper portion 112 and the second engagement portion 146. While an end of the double aperture flexible piece 160 close to the second aperture 164 is fastened to the second engagement portion 146, a portion of the double aperture flexible piece 160 surrounded the second aperture 164 is partially fastened inside the trench portions 148. Therefore, the trench portions 148 can enhance the strength of coupling between the double aperture flexible piece 160 and the fixing structure 140, in the meanwhile, the trench portions 148 can also prevent an end of the double aperture flexible piece 160 close to the second aperture 164 disengaging from the second engagement portion 146. In addition, the width of the trench portions 148 can restricted the compatible size of the double aperture flexible piece 160, such that the trench portions 148 can also prevent confusing the second aperture 164 with the first aperture 162 during fastening the double aperture flexible piece 160.

Figure 2C:
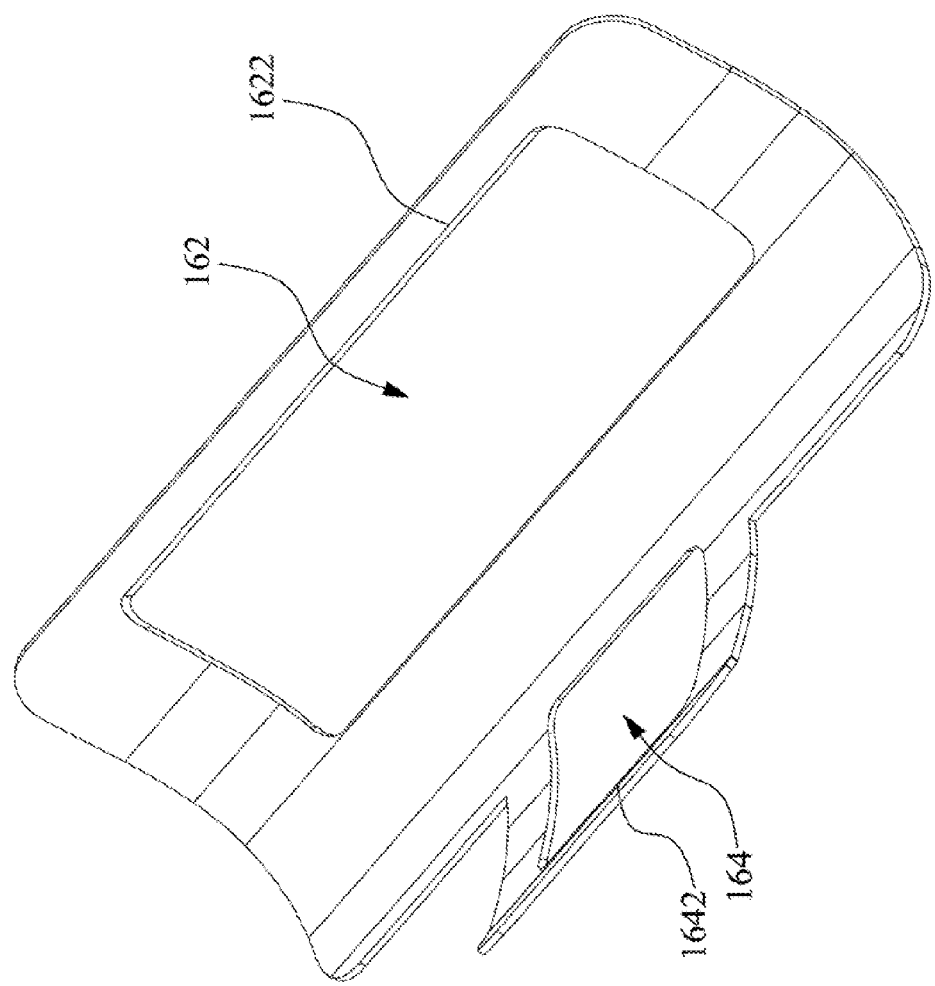
FIG. 2C is a 3D perspective view of a double aperture flexible piece of an EMI-proof server chassis according to an embodiment of the present disclosure from another angle.

FIG. 2C is a 3D perspective view of a double aperture flexible piece 160 of an EMI-proof server chassis 100 according to an embodiment of the present disclosure from another angle. As shown in FIG. 2C, an area of the first aperture 162 of the double aperture flexible piece 160 is greater than an area of the second aperture 164 of the double aperture flexible piece 160. Referred to the FIG. 2A, a sectional area of the first engagement portion 144 along a direction perpendicular to the prolonged direction A, corresponded to the first aperture 162, is greater than a sectional area of the second engagement portion 146 along a direction perpendicular to the prolonged direction A, corresponded to the second aperture 164. Therefore, the first aperture 162 and the second aperture 164 can be easily identified during assembling of the double aperture flexible piece 160. In the meanwhile, after the double aperture flexible piece 160 being assembled onto the EMI-proof server chassis 100, the first engagement portion 144, corresponded to the first aperture 162, is located at the inner side of the EMI-proof server chassis 100 and remained unseen from outside. That is, the EMI-proof server chassis 100 can set an engagement portion with greater area, such as the first engagement portion 144, to fortify the coupling between the double aperture flexible piece 160 and the fixing structure 140.

FIG. 3 is a longitude sectional view of an EMI-proof server chassis 100 along line 1-1' in FIG. 1 according to an embodiment of the present disclosure. An end of the first engagement portion 144 away from the second engagement portion 146 relative to an end of the second engagement portion 146 away from the first engagement portion 144 are separated a first distance D1 along the prolonged direction A, and an edge 1622 of the first aperture 162 away from the second aperture 164 (as shown in FIG. 2C) relative to an edge 1642 of the second aperture 164 away from the first aperture 162 (as shown in FIG. 2C) are separated a second distance D2 along the prolonged direction A, the second distance D2 is lesser than the first distance D1. Due to the second distance D2 of the double aperture flexible piece 160 is lesser than the first distance D1 of the fixing structure 140 coupled with the double aperture flexible piece 160 after the double aperture flexible piece 160 assembled onto the fixing structure 140, such that preventing or decreasing the double aperture flexible piece 160 being disengaged from the fixing structure 140.

In some embodiments, the double aperture flexible piece 160 is configured for a force exert on the double aperture flexible piece 160, in order to drive or move the edge 1622 of the first aperture 162 away from the second aperture 164 relative to the edge 1642 of the second aperture 164 away from the first aperture 162 are separated a third distance D3 (not drawn) along the prolonged direction A, and the third distance D3 is greater than the first distance D1. When a force, along a specific direction, is exerted on the double aperture flexible piece 160 to enlarge the distance between the edge 1622 of the first aperture 162 away from the second aperture 164 and the edge 1642 of the second aperture 164 away from the first aperture 162 till the third distance D3, such that the double aperture flexible piece 160 can be removed or disassembled from the EMI-proof server chassis 100 or the fixing structure 140, owing to the third distance D3 is greater than the first distance D1, to excess the restriction of the fixing structure 140. It should be noted that, the third distance D3 described herein is not a specific value, the only restriction of the third distance D3 is greater than the first distance D1.

In some embodiments, the end of the first engagement portion 144 away from the second engagement portion 146 relative to an edge of the connection portion 142 close to the second engagement portion 146 are separated a fourth distance D4 along the prolonged direction A, an edge 1622 of the first aperture 162 away from the second aperture 164 (as shown in FIG. 2C) relative to an edge 1642 of the second aperture 164 away from the first aperture 162 (as shown in FIG. 2C) are separated a second distance D2 along the prolonged direction A, and the second distance D2 is lesser than the fourth distance D4. Due to the second distance D2 of the double aperture flexible piece 160 is lesser than the fourth distance D4 between the end of the first engagement portion 144 away from the second engagement portion 146 and the edge of the connection portion 142 close to the second engagement portion 146 on the fixing structure 140, coupled with the double aperture flexible piece 160 after the double aperture flexible piece 160 assembled onto the fixing structure 140, such that effectively preventing or decreasing the double aperture flexible piece 160 being disengaged from the fixing structure 140 during moving.

In some embodiments, the chassis 110 or the fixing structure 140 further includes a curved portion 150. The curved portion 150 is connected to an end of the first engagement portion 144 away from the second engagement portion 146. The curved portion 150 is tilting bending relative to a reference plane of the connection portion 142. Therefore, if the double aperture flexible piece 160 tends to be removed or disengaged from the first engagement portion 144 after assembled onto the fixing structure 140, the end of the double aperture flexible piece 160 away from the second aperture 164 needs to be lifted higher than a height of an end of the curved portion 150 away from the connection portion 142, in the meanwhile, a portion of the double aperture flexible piece 160 between the first aperture 162 and the second aperture 164 would be abutted to the connection portion 142, such that effectively preventing or decreasing the double aperture flexible piece 160 being disengaged from the fixing structure 140.

In some embodiments, the chassis 110 or the fixing structure 140 further includes an abut portion 152. The abut portion 152 is connected to an end of the connection portion 142 close to the first engagement portion 144, the abut portion 152 is adjoined with the first engagement portion 144, and the double aperture flexible piece 160 is partially restricted between the curved portion 150 and the abut portion 152. Therefore, if the double aperture flexible piece 160 tends to be removed or disengaged from the second engagement portion 146 after assembled onto the fixing structure 140, the end of the double aperture flexible piece 160 away from the first aperture 162 needs to be bended till disengaged from the second engagement portion 146, in the meanwhile, a portion of the double aperture flexible piece 160 surrounded the first aperture 162 would be abutted to the abut portion 152, such that effectively preventing or decreasing the double aperture flexible piece 160 being disengaged from the fixing structure 140.

Summarized from the above, the present disclosure provides a EMI-proof server chassis, including a chassis, an electronic component, a fixing structure and a double aperture flexible piece. The EMI-proof server chassis can provide protection of electromagnetic interference and discharge electrostatic charges accumulated on the electronic component through connecting the double aperture flexible piece to the electronic component. The design of the fixing structure and the double aperture flexible piece enable the EMI-proof server chassis being assembled easily, and capable to prevent or decrease the double aperture flexible piece being disengaged from the fixing structure. In addition, owing to the feature structures of the fixing structure matching the double aperture flexible piece, such as a first engagement portion, a second engagement portion, a stopper portion, a curved portion and an abut portion etc., enhance the coupling between the fixing structure and the double aperture flexible piece. Therefore, the EMI-proof server chassis of the present disclosure can save the assembling time, and also prevent the double aperture flexible piece being disengaged from the chassis.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabricate, composition of matter, means, methods, and steps described in the specification. As one of ordinary skill in the art will readily appreciate from the disclosure of the present disclosure, processes, machines, fabricate, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabricate, compositions of matter, means, methods, or steps.

What is claimed is:

1. An EMI-proof server chassis for preventing EMI on an electronic component, comprising:
a chassis, comprising:
a connection portion, connected to the chassis;
a first engagement portion and a second engagement portion, connected to the connection portion, and disposed on two sides of the connection portion, the first engagement portion and the second engagement portion are prolonged along a prolonged direction and substantially opposite to each other; and
a double aperture flexible piece, shaped as a curvature plate, the double aperture flexible piece having a first aperture and a second aperture on two sides, wherein the first engagement portion and the second engagement portion are engaged to the first aperture and the second aperture respectively, and a portion of the double aperture flexible piece between the first aperture and the second aperture is curved toward the electronic component, and contact with the electronic component.

2. The EMI-proof server chassis of claim 1, wherein an end of the first engagement portion away from the second engagement portion relative to an end of the second engagement portion away from the first engagement portion are separated a first distance along the prolonged direction, and an edge of the first aperture away from the second aperture relative to an edge of the second aperture away from the first aperture are separated a second distance along the prolonged direction, the second distance is lesser than the first distance.

3. The EMI-proof server chassis of claim 2, wherein the double aperture flexible piece is configured for a force exert on the double aperture flexible piece, to drive the edge of the first aperture away from the second aperture relative to the edge of the second aperture away from the first aperture are separated a third distance along the prolonged direction, and the third distance is greater than the first distance.

4. The EMI-proof server chassis of claim 2, wherein the end of the first engagement portion away from the second engagement portion relative to an edge of the connection portion close to the second engagement portion are separated a fourth distance along the prolonged direction, and the second distance is lesser than the fourth distance.

5. The EMI-proof server chassis of claim 1, wherein an area of the first aperture is greater than an area of the second aperture, and a sectional area of the first engagement portion is greater than a sectional area of the second engagement portion along a direction perpendicular to the prolonged direction.

6. The EMI-proof server chassis of claim 1, wherein the chassis further comprises a curved portion, connected to an end of the first engagement portion away from the second engagement portion, the curved portion is tilting bending relative to a reference plane of the connection portion.

7. The EMI-proof server chassis of claim 6, wherein the chassis further comprises an abut portion, connected to an end of the connection portion close to the first engagement portion, the abut portion is adjoined with the first engagement portion, and the double aperture flexible piece is partially restricted between the curved portion and the abut portion.

8. The EMI-proof server chassis of claim 1, wherein the chassis further comprises a stopper portion, connected to an end of the chassis close to the second engagement portion, the stopper portion is disposed on two sides of the second engagement portion, while the double aperture flexible piece is fastened with the second engagement portion, the double aperture flexible piece is partially restricted between the stopper portion and the second engagement portion.

9. The EMI-proof server chassis of claim 8, wherein the stopper portion and the second engagement portion, and the connection portion are collectively formed a trench portion, adjoined the second engagement portion, wherein while an end of the double aperture flexible piece close to the second aperture is fastened to the second engagement portion, a portion of the double aperture flexible piece surrounded the second aperture is partially fastened inside the trench portion.

10. The EMI-proof server chassis of claim 1, wherein the electronic component is electrically-connected to a grounding structure through the double aperture flexible piece.

* * * * *